(12) United States Patent
Elliot et al.

(10) Patent No.: US 11,222,804 B2
(45) Date of Patent: *Jan. 11, 2022

(54) ELECTROSTATIC CHUCK FOR CLAMPING IN HIGH TEMPERATURE SEMICONDUCTOR PROCESSING AND METHOD OF MAKING SAME

(71) Applicant: Watlow Electric Manufacturing Company, St. Louis, MO (US)

(72) Inventors: Brent Donald Alfred Elliot, Cupertino, CA (US); Frank Balma, Los Gatos, CA (US); Michael Parker, Brentwood, CA (US); Jason Stephens, San Francisco, CA (US); Guleid Hussen, San Francisco, CA (US)

(73) Assignee: WATLOW ELECTRIC MANUFACTURING COMPANY, St. Louis, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/817,627

(22) Filed: Mar. 13, 2020

(65) Prior Publication Data

US 2020/0357676 A1 Nov. 12, 2020

Related U.S. Application Data

(63) Continuation of application No. 15/341,843, filed on Nov. 2, 2016, now Pat. No. 10,593,584.

(Continued)

(51) Int. Cl.
*H01T 23/00* (2006.01)
*H01L 21/683* (2006.01)
(Continued)

(52) U.S. Cl.
CPC ............ *H01L 21/6833* (2013.01); *B23K 1/00* (2013.01); *B23K 1/008* (2013.01); *B23K 1/0016* (2013.01); *B23K 1/19* (2013.01); *B23K 1/206* (2013.01); *B23Q 3/15* (2013.01); *C04B 37/00* (2013.01); *C04B 37/003* (2013.01);
(Continued)

(58) Field of Classification Search
None
See application file for complete search history.

(56) References Cited

U.S. PATENT DOCUMENTS

| | | | |
|---|---|---|---|
| 5,368,220 A | 11/1994 | Mizuhara et al. |
| 5,413,360 A | 5/1995 | Atari et al. |

(Continued)

FOREIGN PATENT DOCUMENTS

| | | |
|---|---|---|
| JP | H0870036 | 3/1996 |
| JP | H08279550 | 10/1996 |

(Continued)

*Primary Examiner* — Stephen W Jackson
(74) *Attorney, Agent, or Firm* — Burris Law, PLLC (57) ABSTRACT

An electrostatic chuck with a top surface adapted for Johnsen-Rahbek clamping in the temperature range of 500 C to 750 C. The top surface may be sapphire. The top surface is attached to the lower portion of the electrostatic chuck using a braze layer able to withstand corrosive processing chemistries. A method of manufacturing an electrostatic chuck with a top surface adapted for Johnsen-Rahbek clamping in the temperature range of 500 C to 750 C.

20 Claims, 9 Drawing Sheets

Related U.S. Application Data (60) Provisional application No. 62/249,559, filed on Nov. 2, 2015.

(51) Int. Cl.
| | | |
|---|---|---|
| *B23Q 3/15* | (2006.01) | |
| *B23K 1/00* | (2006.01) | |
| *C04B 37/00* | (2006.01) | |
| *H01L 21/687* | (2006.01) | |
| *B23K 1/19* | (2006.01) | |
| *B23K 1/20* | (2006.01) | |
| *B23K 1/008* | (2006.01) | |
| B23K 103/18 | (2006.01) | |
| B23K 103/00 | (2006.01) | |
| B23K 101/42 | (2006.01) | |

(52) U.S. Cl.
CPC .... *H01L 21/6831* (2013.01); *H01L 21/68757* (2013.01); *B23K 2101/42* (2018.08); *B23K 2103/18* (2018.08); *B23K 2103/52* (2018.08); *B23K 2103/54* (2018.08); *C04B 2237/121* (2013.01); *C04B 2237/343* (2013.01); *C04B 2237/366* (2013.01); *C04B 2237/50* (2013.01); *C04B 2237/68* (2013.01)

(56) References Cited

U.S. PATENT DOCUMENTS

| | | | |
|---|---|---|---|
| 9,589,826 B2* | 3/2017 | Ono | C04B 37/026 |
| 10,289,224 B2* | 5/2019 | Lin | G06F 3/0412 |
| 10,593,584 B2 | 3/2020 | Elliot et al. | |
| 2005/0221729 A1 | 10/2005 | Lee | |
| 2014/0099485 A1 | 4/2014 | Narendrnath et al. | |
| 2015/0108203 A1 | 4/2015 | Elliot et al. | |

FOREIGN PATENT DOCUMENTS

| | | |
|---|---|---|
| JP | H09186112 | 7/1997 |
| JP | 2003264223 | 9/2003 |
| JP | 2004349664 | 12/2004 |
| JP | 2008028052 | 2/2008 |
| JP | 2015505806 | 2/2015 |
| WO | 2008099789 | 8/2008 |

\* cited by examiner

ELECTROSTATIC CHUCK FOR CLAMPING IN HIGH TEMPERATURE SEMICONDUCTOR PROCESSING AND METHOD OF MAKING SAME

CROSS-REFERENCE TO RELATED APPLICATIONS

This application is a continuation of U.S. patent application Ser. No. 15/341,843 to Elliot et al., filed Nov. 2, 2016 now U.S. Pat. No. 10,593,584, which claims priority to U.S. Provisional Application No. 62/249,559, to Elliot et al., filed Nov. 2, 2015.

BACKGROUND

Field of the Invention

The present invention relates to an electrostatic chuck adapted for clamping at high temperatures, and a method for manufacturing an electrostatic chuck adapted for clamping at high temperatures.

Description of Related Art

Electrostatic clamps or chucks (ESCs) are often utilized in the semiconductor industry for clamping substrates during plasma-based or vacuum-based semiconductor processes such as etching, CVD, and ion implantation, etc. Capabilities of the ESCs, including non-edge exclusion and wafer temperature control, have proven to be quite valuable in processing semiconductor substrates or wafers, such as silicon wafers. A typical ESC, for example, comprises a dielectric layer positioned over a conductive electrode, wherein the semiconductor wafer is placed on a surface of the ESC (e.g., the wafer is placed on a surface of the dielectric layer). During semiconductor processing (e.g., ion implantation, plasma processing, etc.), a clamping voltage is typically applied between the wafer and the electrode, wherein the wafer is clamped against the chuck surface by electrostatic forces.

A subset of electrostatic clamps, referred to as Johnsen-Rahbek (J-R) clamps, utilize "leaky" dielectric layers (e.g., semiconductive dielectric layers having bulk resistances of between approximately $1\times10^9$ to $1\times10^{11}$ Ohm-cm) in contact with the wafer, wherein greater clamping forces can be achieved at lower voltages than with conventional Coulombic clamps. Lower voltage input to the ESC typically not only reduces power supply requirements associated with the J-R clamps, but further provides a clamping environment that is potentially less destructive to the wafer and devices formed thereon.

A conventional J-R clamp, for example, comprises a dielectric layer that is slightly conductive, thus generally permitting a thickness of the dielectric layer (e.g., a ceramic) to be much thicker than would be permitted for a "classic" or Coulombic ESC. Such an increase in thickness greatly facilitates the ESC manufacturing process, while also reducing clamp operating voltages. For example, the dielectric layer can be used as a base for the formation of positive and negative electrodes by screen printing and firing of a dielectric paste.

In some applications, processing of the wafer can occur at low temperatures (e.g., −50 C), while in other applications, processing of the wafer can occur at higher temperatures (e.g., 150 C). Some J-R clamping electrostatic chucks can go to somewhat higher temperatures using an AlN top surface. Conventionally, a single J-R clamp, however, cannot accommodate both extremes of temperature, as the resistivity of the dielectric layer changes with temperature. Thus, the clamping force exhibited by a conventional J-R clamp varies dramatically with temperature, yielding potential undesirable clamping effects.

Some aluminum nitride based electrostatic chucks are able to provide J-R clamping at temperatures in the range of 250-450 C, but the bulk resistivity of the AlN gets too low above about 400 C to allow for effective clamping.

What is called for is an electrostatic chuck which can provide J-R clamping at temperatures higher than 450 C and which can withstand corrosive processing chemistries. The electrostatic chuck may have a sapphire top surface. The top surface may be affixed to the lower portion of the chuck with an aluminum brazing layer which can withstand corrosive processing chemistries.

SUMMARY OF THE INVENTION

An electrostatic chuck with a top surface adapted for Johnsen-Rahbek clamping in the temperature range of 500 C to 750 C The top surface may be sapphire. The top surface is attached to the lower portion of the electrostatic chuck using a braze layer able to withstand corrosive processing chemistries. A method of manufacturing an electrostatic chuck with a top surface adapted for Johnsen-Rahbek clamping in the temperature range of 500 C to 750 C.

DETAILED DESCRIPTION

Some prior processes for the joining of ceramic materials required specialized ovens, and compression presses within the ovens, in order to join the materials. The materials joined may have resulted in an electrostatic chuck, for example. One prior process, for example, with liquid phase sintering, two pieces may be joined together under very high temperatures and contact pressures. The high temperature liquid-phase sintering process may see temperatures in the range of 1700 C and contact pressures in the range of 2500 psi. When a substrate support pedestal is manufactured using such processes, significant amounts of time are needed, specialized ovens, presses, and fixturing, and the overall process is very expensive. It is also extremely unlikely, if not impossible, to rework or repair certain defects in an electrostatic chuck manufactured using liquid phase sintering.

In one embodiment of the invention, an electrostatic chuck is provided having a top surface adapted for Johnsen-Rahbek clamping. In one embodiment, the top surface is adapted for Johnsen-Rahbek clamping at temperatures over 450 C. In one embodiment, the top surface is adapted for Johnsen-Rahbek clamping in the temperature range of 500 C to 700 C. In one embodiment, the top surface is adapted for Johnsen-Rahbek clamping in the temperature range of 500 C to 750 C. In one embodiment, the top surface is of any suitable material. In one embodiment, the top surface is a layer of a material having a bulk resistivity in the range of 10E9 ohm-cm to 10E11 ohm-cm over the temperature range of 500 C to 750 C. In one embodiment, the top surface is of sapphire. In one embodiment, the top surface is a top layer of sapphire, which can be affixed to lower portion of the chuck. In one embodiment, the top layer of sapphire is affixed to an underlying layer. In one embodiment, the underlying layer is a ceramic layer. In one embodiment, an electrostatic chuck is provided having a top surface of sapphire.

The sapphire layer may be of any suitable thickness. In one embodiment, the sapphire layer has a thickness ranging from 250 to 1000 microns. In one embodiment, the sapphire layer has a thickness of 500 microns.

The sapphire layer may be affixed to the underlying portion of the chuck in any suitable manner. In one embodiment, the top layer is attached to the underlying portion of the chuck by a joining layer that is able to withstand corrosive processing chemistries. In one embodiment, the corrosive processing chemistries are a semiconductor processing environment within a processing chamber. In one embodiment, the joining layer is formed by a braze layer. In one embodiment, the braze layer is an aluminum brazing layer.

In one embodiment, a sapphire layer of the electrostatic chuck is joined to an underlying ceramic layer by joining braze layer at any suitable temperature. In one embodiment, the temperature is at least 770 C. In one embodiment, the temperature is at least 800 C. In one embodiment, the temperature is less than 1200 C. In one embodiment, the temperature is between 770 C and 1200 C. In one embodiment, the temperature is between 800 C and 1200 C.

In one embodiment, a sapphire layer of the electrostatic chuck is joined to an underlying ceramic layer by joining braze layer at any suitable temperature, including any of the temperatures disclosed herein, in a suitable environment. In one embodiment, the environment is a nonoxygenated environment. In one embodiment, the environment is free of oxygen. In one embodiment, the environment is in the absence of oxygen. In one environment, the environment is a vacuum. In one embodiment, the environment is at a pressure lower than 1×10E-4 Torr. In one embodiment, the environment is at a pressure lower than 1×10E-5 Torr. In one embodiment, the environment is an argon (Ar) atmosphere. In one embodiment, the environment is an atmosphere of other noble gasses. In one embodiment, the environment is an hydrogen (H2) atmosphere.

In one embodiment, a sapphire layer of the electrostatic chuck is joined to an underlying ceramic layer at any suitable temperature, including any of the temperatures disclosed herein, in a suitable environment, including any of the environments disclosed herein, by a braze layer. In one embodiment, the braze layer is pure aluminum. In one embodiment, the braze layer is metallic aluminum of greater than 89% by weight. In one embodiment, the braze layer has more than 89% aluminum by weight. In one embodiment, the braze layer is metallic aluminum of greater than 99% by weight. In one embodiment, the braze layer has more than 99% aluminum by weight.

In one embodiment, a sapphire layer of the electrostatic chuck is joined to an underlying ceramic layer at any suitable temperature, including any of the temperatures disclosed herein, in a suitable environment, including any of the environments disclosed herein, by an aluminum joining layer, including an aluminum joining layer formed by any of the aluminum braze layers disclosed herein. In on embodiment, the aluminum joining layer is free of diffusion bonding. In one embodiment, the process of forming the aluminum joining layer is free of diffusion bonding. In one embodiment, there is no diffusion bonding between the sapphire layer and the aluminum joining layer. In one embodiment, there is no diffusion bonding between the ceramic layer and the aluminum joining layer. In one embodiment, the aluminum joining layer forms a hermetic seal between the sapphire layer and the ceramic layer. In one embodiment, the aluminum joining layer forms a hermetic seal between the sapphire layer and the ceramic layer having a vacuum leak rate of <1×10E-9 sccm He/sec. In one embodiment, the aluminum joining layer is able to withstand corrosive processing chemistries. In one embodiment, the corrosive processing chemistries are a semiconductor processing environment within a processing chamber.

The underlying ceramic can be made from any suitable material, including aluminum nitride, aluminum oxide or alumina, sapphire, yttrium oxide, zirconia, and beryllium oxide.

The foregoing embodiments of the invention can be combined in any manner. The embodiments of the invention set forth below are examples of the invention, and may in some instances be broader than the foregoing embodiments of the invention but are not intended to limit the breadth of the foregoing embodiments or the breadth of the invention. Additional features of the invention set forth in the embodiments of the invention set forth below are optional. A feature of any embodiment set forth below can be combined with any of the foregoing embodiments, with or without any other feature of any embodiment set forth below. All characteristics, steps, parameters and features of the methods below are not limited to the specific embodiments or specific parts set forth below, but instead are equally applicable to the foregoing embodiments of the invention and to all embodiments of the invention. Broad terms and descriptors are sometimes replaced herein with more specific terms and descriptors, not to limit a disclosure to a specific term or descriptor but merely for ease of discussion and understanding.

Figure 1:
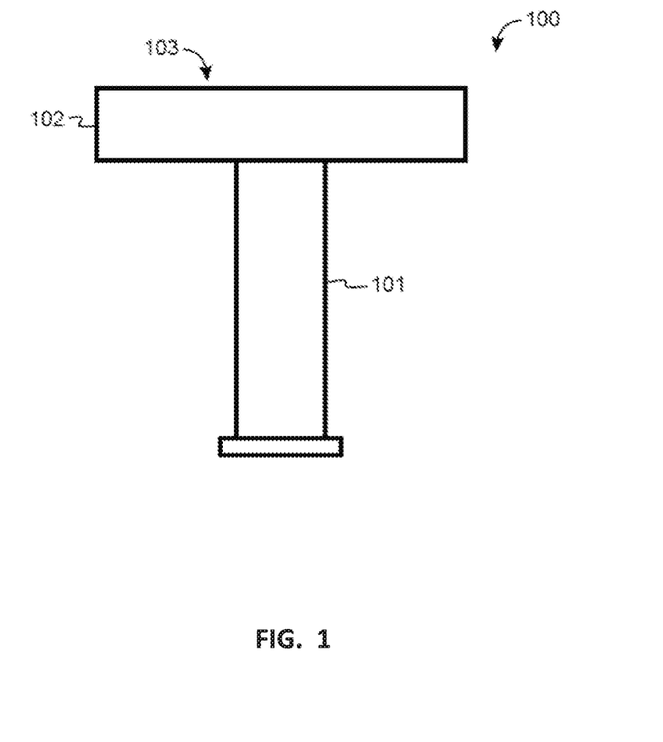
FIG. 1 is a view of a plate and shaft device used in semiconductor processing according to some embodiments of the present invention.

FIG. 1 illustrates an exemplary substrate support pedestal 100, such as an electrostatic chuck, used in semiconductor processing. In some aspects, the substrate support pedestal 100 is composed of a ceramic, such as aluminum nitride. The electrostatic chuck has a shaft 101 which in turn supports a plate 102. The plate 102 has a top surface 103. The shaft 101 may be a hollow cylinder. The plate 102 may be a flat disc. Other subcomponents may be present.

Figure 2:
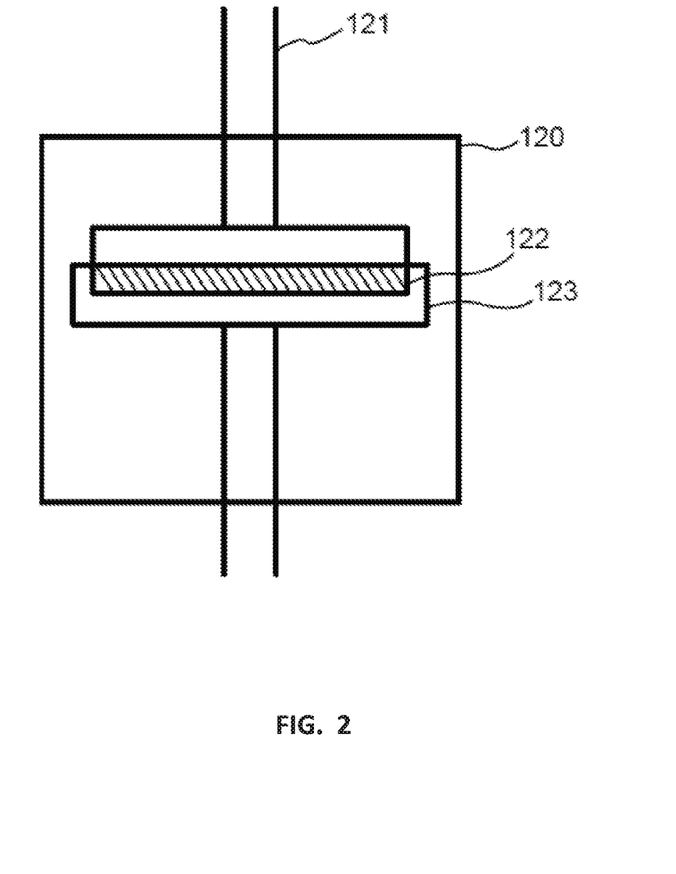
FIG. 2 is a sketch of a high temperature press and oven for a plate according to some embodiments of the present invention.

FIG. 2 conceptually illustrates a process oven 120 with a press 121. The plate 122 may be compressed under temperature in a fixture 123 adapted to be pressed by the press 121. The shaft 101 may also be similarly manufactured in a process step. In a typical process, the plate and shaft are formed by loading of aluminum nitride powder incorporating a sintering aide such as yttria at about 2 weight % into a mold, followed by compaction of the aluminum nitride powder into a "solid" state typically referred to as "green" ceramic, followed by a high-temperature liquid-phase sintering process which densities the aluminum nitride powder into a solid ceramic body. The high temperature liquid-phase sintering process may see temperatures in the range of 1700 C and contact pressures in the range of 2500 psi. The bodies are then shaped into the required geometry by standard grinding techniques using diamond abrasives.

There are multiple functions of the shaft: one is to provide vacuum-tight electrical communication through the wall of the vacuum chamber in order to apply electrical power to heater elements as well as a variety of other electrode types which may be embedded within the heater plate. Another is to allow use of a standard rubber or polymeric o-ring to seal the end of the shaft against the chamber wall. In high temperature applications, the shaft is used to lower the temperature at the connection point to the chamber wall. Another is to allow temperature monitoring of the heater plate using a monitoring device such as a thermocouple, and allowing that thermocouple to reside outside of the processing chamber environment in order to avoid interaction such as corrosion between the materials of the thermocouple and the process chemicals, as well as allowing the thermocouple junction to operate in a non-vacuum environment for rapid response. Another function is to provide isolation of the materials used for the previously mentioned electrical communication from the processing environment. Materials used for electrical communication are typically metallic, which could thereby interact with process chemicals used in the processing environment in ways which could be detrimental to the processing results, and detrimental to the lifetime of the metallic materials used for electrical communication.

Figure 3:
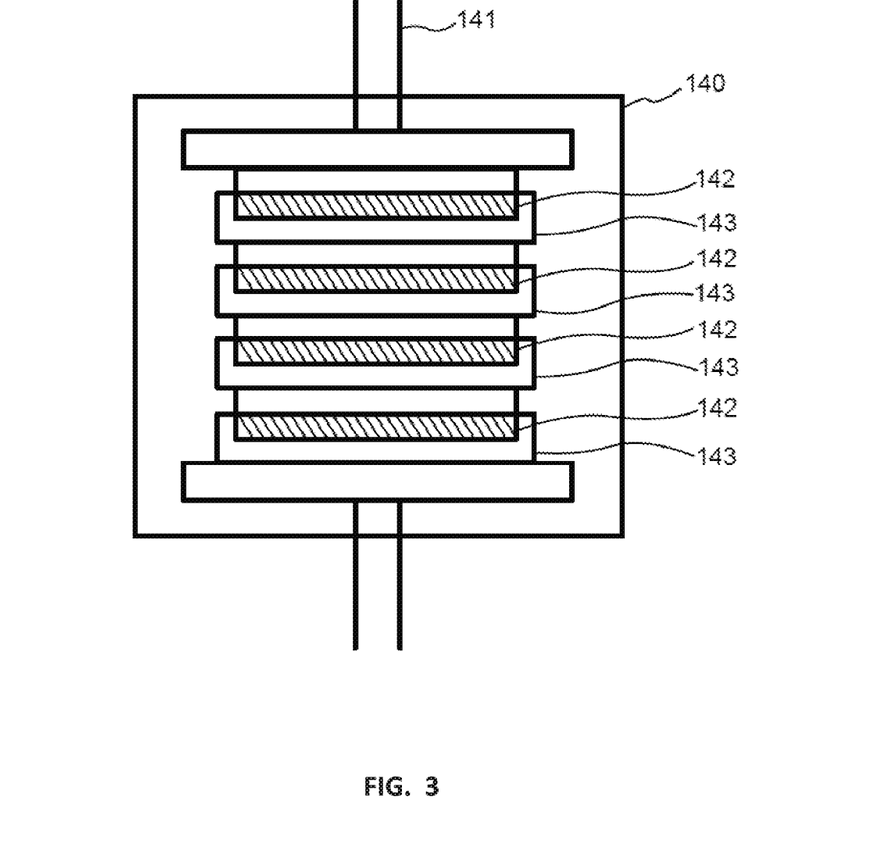
FIG. 3 is a sketch of a high temperature press and oven for a plurality of plates according to some embodiments of the present invention.

FIG. 3 conceptually illustrates a process oven 140 with a press 141. Given the relatively flat nature of the plate, a plurality of plates 142 may be formed in a single process by stacking a plurality of plate molding fixtures 143 along the axial direction of the press 141 which resides within the process oven 140, as seen conceptually in FIG. 3. The shafts may also be formed in a similar process using the press in the process oven. Each of these ceramic forming operations involve significant time, energy, and expense.

In the overall process of manufacturing an electrostatic chuck used in semiconductor processing both the step of forming plates and forming shafts require significant commitments of time and energy. Given the cost of the specialized high temperature ovens with physical presses, and that the process steps of forming the plates and forming the shafts each may require the use of a specialized process oven for days, a considerable investment of both time and money has been invested just to get the overall process to the point where the shaft and plate have been completed. Yet a further step in the specialized process oven is required in present processes to affix the plate to the shaft. An example of this step would be to join the shaft to the plate using a liquid phase sintering step in the specialized high temperature process oven with a press. This third step in the specialized process oven also requires significant space in such a process oven as the assembled configuration of the heater includes both the length of the shaft and the diameter of the plate. Although the manufacture of just the shafts may take a similar amount of axial length, the diameter of the shafts is such that multiple shafts may be produced in parallel in a single process.

Figure 4:
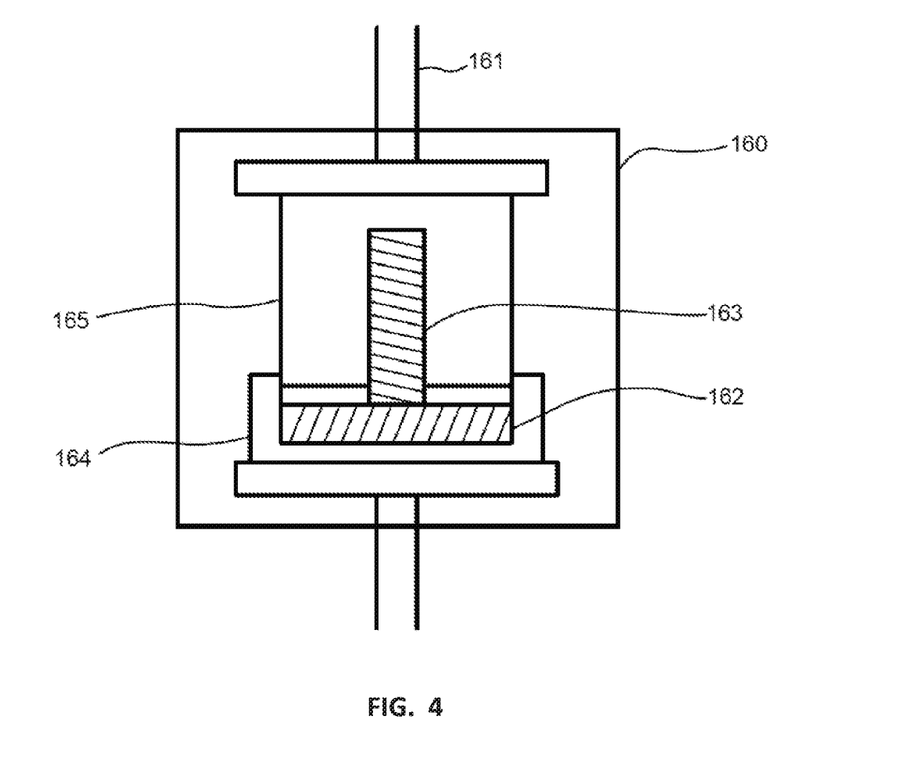
FIG. 4 is a sketch of a high temperature press and oven for a plate and shaft device.

As seen in FIG. 4, the joining process to sinter the shaft to the plate again requires the use of a process oven 160 with a press 161. A set of fixturing 164, 165 is used to position the plate 162 and the shaft 163, and to transmit the pressure delivered by the press 161.

Once the electrostatic chuck is completed, it may be used in semiconductor processing. The electrostatic chuck is likely to be used in harsh conditions, including corrosive gasses, high temperatures, thermal cycling, and gas plasmas.

Figure 5:
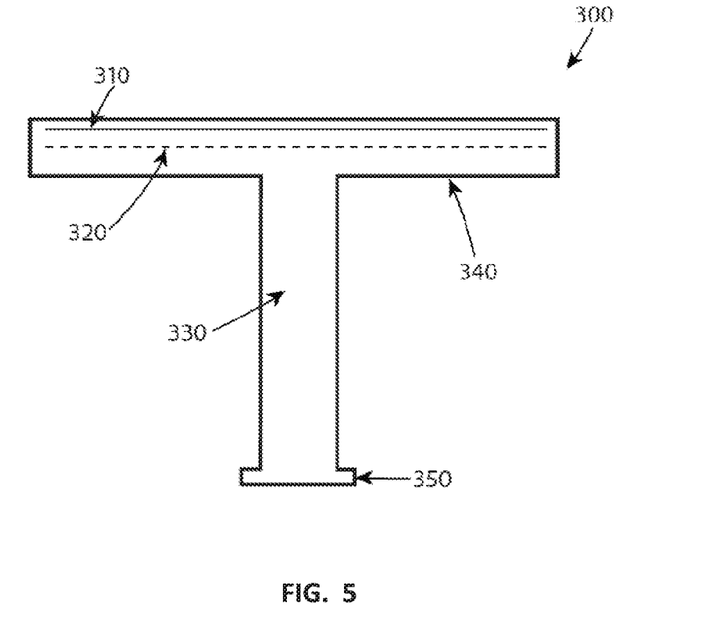
FIG. 5 is view of a plate and shaft device according to some embodiments of the present invention.

FIG. 5 shows one embodiment of a schematic illustration of a substrate support pedestal used in a semiconductor processing chamber. The substrate support pedestal 300, which may be a ceramic heater, or electrostatic chuck, or both, can include a radio frequency antenna and/or clamping electrode 310, a heater element 320, a shaft 330, a plate 340, and a mounting flange 350. The radio frequency antenna 310 may be very close to the top surface of mounting plate. In some aspects, the location seen for the radio frequency antenna may be where instead a clamping electrode resides. In some aspects, there may be multiple radio frequency antennae and or clamping electrodes. In some aspects, one electrode may be used as both a clamping electrode and a radio frequency antenna concurrently.

Figure 6:
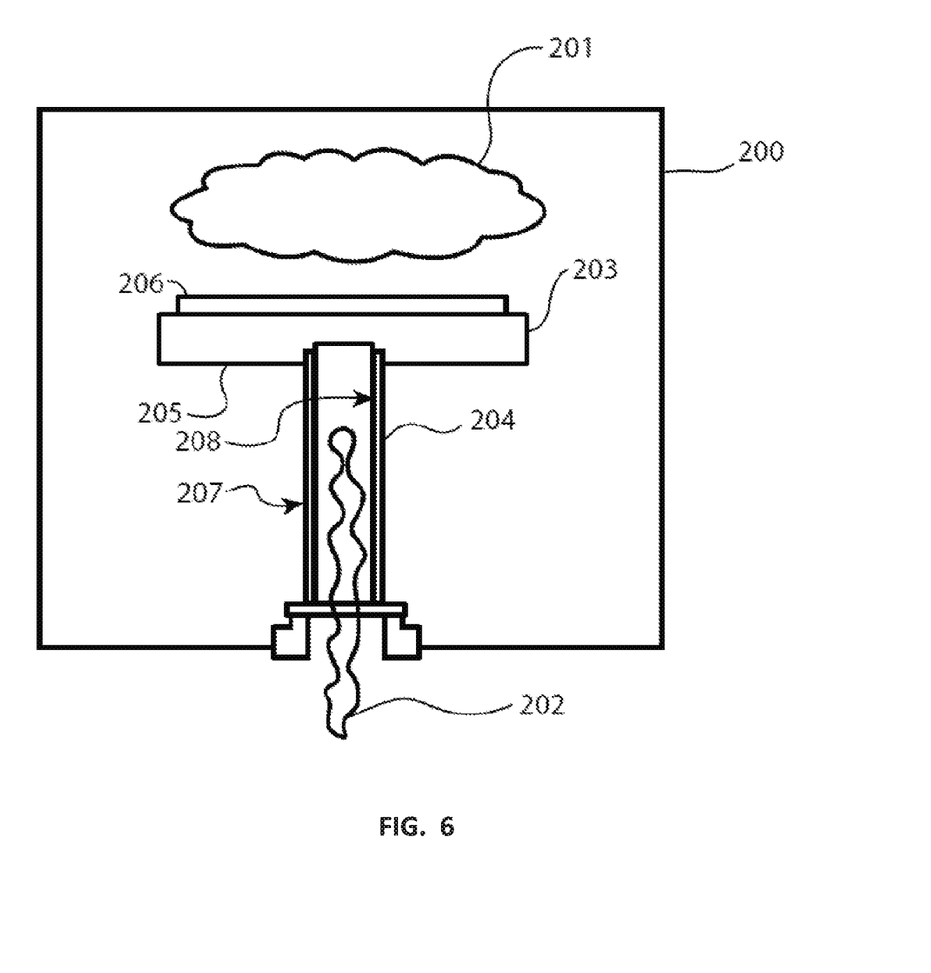
FIG. 6 is a partial cross-sectional view of a plate and shaft device in use in semiconductor manufacturing according to some embodiments of the present invention.

As seen in FIG. 6, the substrate support pedestal may bridge between two distinct atmospheres, both of which may present significant problems for prior brazing materials. On an external surface 207 of the semiconductor processing equipment, such as a heater or an electrostatic chuck 205, the materials must be compatible with the processes occurring in, and the environment 201 present in, the semiconductor processing chamber 200 in which the pedestal 205 will be used. These may include fluorine chemistries, and other extremely volatile, or corrosive, chemistries. The substrate support pedestal 205 may have a substrate 206 affixed to a top surface of the plate 203, which is supported by a shaft 204. On an internal surface 208 of the substrate support pedestal 205, the materials must be compatible with a different atmosphere 202, which may be an oxygenated atmosphere. Materials containing copper, silver, or gold may interfere with the lattice structure of the silicon wafer being processed, and are thus not appropriate. For any repairs which may use brazing as part of the repair process, the braze material may be exposed to an oxygenated atmosphere within the center of the hollow shaft. The portion of the braze joint which would be exposed to this atmosphere will oxidize, and may oxidize into the joint, resulting in a failure of the hermeticity of the joint. In addition to structural attachment, braze materials used in the area of the shaft and the plate of these devices to be used in semiconductor manufacturing must be hermetic in many, if not most or all, uses.

In an exemplary embodiment, the plate and shaft may both be of aluminum oxide (alumina). The plate may be approximately 9-13 inches in diameter and 0.5 to 0.75 inches thick in some embodiments. The shaft may be a hollow cylinder which is 5-10 inches long with a wall thickness of 0.1 inches.

In the manufacture of substrate support pedestals, any step that involves liquid phase sintering which is replaced with a less costly process represents a significant improvement over the costly prior manufacturing methods. One improvement may be to assemble a plate assembly from pre-manufactured ceramic plate layers using a brazing material to join the layers. In some aspects, it may be important that the brazing layer which attaches the ceramic layers to each other, and to the pedestal in some aspects, deliver a hermetic joint. Good and complete wetting, and hermeticity, are desired to eliminate any virtual leaks, wherein a non-hermetic braze layer may "leak" gasses trapped in voids in the braze, into the chamber where the pedestal is later used. This is not a desirable condition. Further, a non-voided, fully wetted, hermetic joint will provide a more consistent, even, thermal path, with more equal thermal conductivity, between the internal heater and the top surface of the pedestal.

An electrostatic chuck with a top layer adapted to provide Johnsen-Rahbek clamping at a higher temperature than previously used, and joined to the lower layer or layers of the plate with a braze layer able to withstand the higher temperatures desired and able to withstand processing chemistries, such as fluorine chemistries, represents a significant improvement over earlier electrostatic chuck designs.

Figure 7:
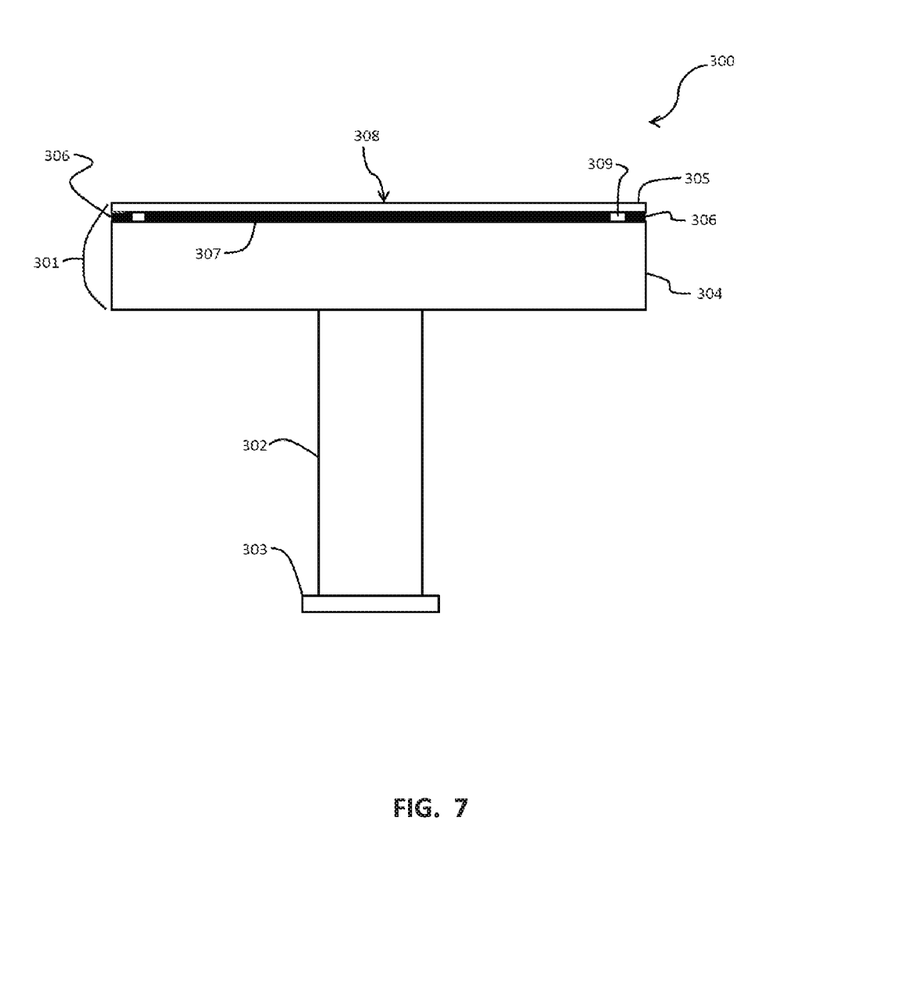
FIG. 7 is a figurative view of an electrostatic chuck according to some embodiments of the present invention.

In some embodiments of the present invention, as seen in FIG. 7, an electrostatic chuck 300 is adapted to provide J-R clamping at temperatures above 450C. The electrostatic chuck 300 may have a plate assembly 301 joined to a shaft 302. The shaft 302 may be hollow and may have a mounting flange 303. The plate assembly 301 has a top surface 308 adapted to support a wafer or other substrate during processing. The top layer 305 may be joined to the joined to a lower plate portion 304 using a braze layer 306. A clamping electrode 307 may reside between the top layer 305 and the lower plate portion 304. The clamping electrode 307 may be separated from the braze layer 306 by a gap 309. The gap 309 may include a labyrinth which removes line of sight pathways between the braze layer 306 and the clamping electrode 307. A labyrinth may not be needed depending upon the width of the gap and the voltage used. In some embodiments, the electrostatic chuck does not have a shaft.

In some aspects, the top layer 305 is selected to have a bulk resistivity of between 10E9 and 10E11 Ohm-cm in the temperature range within which the electrostatic chuck 300 is desired to provide J-R clamping. In some aspects, the lower plate portion 304 is selected to present a close match in its coefficient of thermal expansion relative to the top layer 305. Coefficients of thermal expansion may vary with temperature, so the selection of matching coefficients of thermal expansion should take into account the degree of match from room temperature, through the processing temperatures sought to be supported, and further through to the brazing temperature of the joining layer.

In an exemplary embodiment, the top layer 305 is sapphire, and the lower plate portion is alumina. The coefficient of thermal expansion of sapphire (single crystal aluminum oxide) at 20 C (293 K), 517 C (800 K), and 1017 C (1300 K), respectively, is 5.38, 8.52, and 9.74×10E-6/K. The coefficient of thermal expansion of sintered alumina at 20 C, 500 C, and 1000 C, respectively, is 4.6, 7.1, and 8.1×10E-6/K. These present a good match. In an exemplary embodiment, the brazing layer is aluminum with a purity of over 89%, and may be over 99% Al by weight.

The use of sapphire as the top layer above the clamping electrode allows for J-R clamping in a temperature range of approximately 500 C to 750 C. The bulk resistivity of sapphire at 500 C is 10E11 ohm-cm, and at 750 C is 10E9 ohm-cm. Sapphire provides the proper bulk resistivity over the temperature range of 500 C to 750 C for J-R clamping, and the combination of alumina and sapphire provide a match of coefficients of thermal expansion to allow for successful use when brazed with an appropriate chemistry resistance braze layer, such as aluminum.

In an exemplary embodiment, the top layer 305 may be sapphire and be 0.05 mm thick. The braze layer 306 and the clamping electrode 307 may be 0.05 mm thick and are >99% Al. In some aspects the braze layer is in the range of 0.05 mm to 0.10 m. In some aspects, the lower plate layer may be terraced such that the braze layer and the clamping electrode are different thicknesses. For example, the braze layer may be 0.05 mm thick and the clamping electrode may 0.10 mm thick. This may help facilitate uses wherein the clamping electrode also functions as an rf antenna, and the extra thickness may be useful with higher current levels which might be seen in such a scenario. The lower plate portion may be alumina and be 3 mm thick. This embodiment may be seen without a shaft.

In another exemplary embodiment with a shaft, the top layer 305 may be sapphire and be 0.5 mm thick. The braze layer 306 and the clamping electrode 307 may be 0.05 mm thick and are >99% Al. In some aspects, the lower plate layer and/or the sapphire layer may be terraced such that the braze layer and the clamping electrode are different thicknesses. The lower plate portion may be alumina and be 12 mm thick.

As seen above, the thickness of the braze layer is adapted to be able to withstand the stresses due to the differential coefficients of thermal expansion between the various materials. Residual stresses may be incurred during the cool down from the brazing steps, which are described below. In addition, fast initial temperature ramping from room temperature may cause some temperature non-uniformity across the chuck, which may compound with the residual stresses incurred during brazing.

Aluminum has a property of forming a self-limiting layer of oxidized aluminum. This layer is generally homogenous, and, once formed, prevents or significantly limits additional oxygen or other oxidizing chemistries (such a fluorine chemistries) penetrating to the base aluminum and continuing the oxidation process. In this way, there is an initial brief period of oxidation or corrosion of the aluminum, which is then substantially stopped or slowed by the oxide (or fluoride) layer which has been formed on the surface of the aluminum. The braze material may be in the form of a foil sheet, a powder, a thin film, or be of any other form factor suitable for the brazing processes described herein. For example, the brazing layer may be a sheet having a thickness ranging from 0.00019 inches to 0.011 inches or more. In some embodiments, the braze material may be a sheet having a thickness of approximately 0.0012 inches. In some embodiments, the braze material may be a sheet having a thickness of approximately 0.006 inches. Typically, alloying constituents (such as magnesium, for example) in aluminum are formed as precipitates in between the grain boundaries of the aluminum. While they can reduce the oxidation resistance of the aluminum bonding layer, typically these precipitates do not form contiguous pathways through the aluminum, and thereby do not allow penetration of the oxidizing agents through the full aluminum layer, and thus leaving intact the self-limiting oxide-layer characteristic of aluminum which provides its corrosion resistance. In the embodiments of using an aluminum alloy which contains constituents which can form precipitates, process parameters, including cooling protocols, would be adapted to minimize the precipitates in the grain boundary. For example, in one embodiment, the braze material may be aluminum having a purity of at least 99.5%. In some embodiments, a commercially available aluminum foil, which may have a purity of greater than 92%, may be used. In some embodiments, alloys are used. These alloys may include Al-5w % Zr, Al-5 w % Ti, commercial alloys #7005, #5083, and #7075. These alloys may be used with a joining temperature of 1100 C in some embodiments. These alloys may be used with a temperature between 800 C and 1200 C in some embodiments. These alloys may be used with a lower or higher temperature in some embodiments.

The joining methods according to some embodiments of the present invention rely on control of wetting and flow of the joining material relative to the ceramic pieces to be joined. In some embodiments, the absence of oxygen during the joining process allows for proper wetting without reactions which change the materials in the joint area. With proper wetting and flow of the joining material, a hermetically sealed joint can be attained at a low temperature relative to liquid phase sintering, for example.

In some applications where end products of joined ceramics are used, strength of the joint may not be the key design factor. In some applications, hermeticity of the joint may be required to allow for separation of atmospheres on either side of the joint. In some applications, hermeticity of the joint may be required to prevent virtual leaks within the braze layer. Also, the composition of the joining material may be important such that it is resistant to chemicals which the ceramic assembly end product may be exposed to. The joining material may need to be resistant to the chemicals, which otherwise might cause degeneration of the joint, and loss of the hermetic seal. The joining material may also need to be of a type of material which does not negatively interfere with the processes later supported by the finished ceramic device.

In some embodiments, the joining process is performed in a process chamber adapted to provide very low pressures. Joining processes according to embodiments of the present invention may require an absence of oxygen in order to achieve a hermetically sealed joint. In some embodiments, the process is performed at a pressure lower than $1\times10E-4$ Torr. In some embodiments, the process is performed at a pressure lower than $1\times10E-5$ Torr. In some embodiments, further oxygen removal is achieved with the placement of zirconium or titanium in the process chamber. For example, a zirconium inner chamber may be placed around the pieces which are to be joined.

In some embodiments, atmospheres other than vacuum may be used to achieve a hermetic seal. In some embodiments, argon (Ar) atmosphere may be used to achieve hermetic joints. In some embodiments, other noble gasses are used to achieve hermetic joints. In some embodiments, hydrogen (H2) atmosphere may be used to achieve hermetic joints.

In some embodiments, standoffs may be used to create a minimum braze layer thickness for the joint. In other embodiments, the minimum braze layer thickness for the joint is created by incorporating powdered material into the braze layer filler material. The largest particle size of that incorporated powder material determines the minimum joint thickness. The powdered material may be mixed with powdered braze layer filler material, or painted onto the ceramic joint surface, or painted onto the braze layer filler foil of appropriate thickness, or incorporated directly into the braze layer filler material foil of appropriate thickness. In some embodiments, the braze layer material, prior to brazing, will be thicker than the distance maintained by the mesas or powder particles between the shaft end and the plate. In some embodiments, other methods may be used to establish a minimum braze layer thickness. In some embodiments, ceramic spheres may be used to establish a minimum braze layer thickness. In some aspects, the joint thickness may be slightly thicker than the dimension of the standoffs, or other minimum thickness determining device, as not quite all of the braze material may be squeezed out from between the standoffs and the adjacent interface surface. In some aspects, some of the aluminum braze layer may be found between the standoff and the adjacent interface surface. In some embodiments, the brazing material may be aluminum sputtered onto the ceramic surface to a thickness of 0.0003 inches. In some embodiments, the brazing material may be 0.006 inches thick prior to brazing with a completed joint minimum thickness of 0.004 inches. The brazing material may be aluminum with 0.4 Wt. % Fe.

The use of too high of a temperature, for too long of a time period, may lead to voids forming in the joining layer as the result of significant aluminum evaporation. As voids form in the joining layer, the hermeticity of the joint may be lost. The use of too low of a temperature may lead to joints which are not hermetic. The process temperature and the time duration of the process temperature may be controlled such that the aluminum layer does not evaporate away, and so that a hermetic joint is achieved. With proper temperature and process time duration control, in addition to the other process parameters described above, a continuous joint may be formed. A continuous joint achieved in accord with embodiments as described herein will result in a hermetic sealing of the parts, as well as a structural attachment.

Both hermetic and non-hermetic joints may join pieces strongly, in that significant force is needed to separate the pieces. However, the fact that a joint is strong is not determinative of whether the joint provides a hermetic seal. The ability to obtain hermetic joints may be related to the wetting of the joint. Wetting describes the ability or tendency of a liquid to spread over the surface of another material. If there is insufficient wetting in a brazed joint, there will be areas where there is no bonding. If there is enough non-wetted area, then gas may pass through the joint, causing a leak.

The joints discussed herein use a ceramic, or a plurality of ceramics, which are non-susceptible to diffusion during the joining process. New research has shown that this category of ceramics has been shown to be able to be joined to itself, or to other ceramics within the category, with hermetic joints using the methods described herein. Among the non-diffusing ceramics in this category are sapphire, yttrium oxide, aluminum nitride, alumina, zirconia, and beryllium oxide. Together with the use of temperatures in a range not typical of standard brazing temperatures, and using brazing materials as described herein, and with the atmospheres discussed herein, this group of ceramics may be joined with hermetic joints not formerly attainable. In joints according to embodiments of this invention, hermeticity was verified by having a vacuum leak rate of $<1\times10E-9$ sccm He/sec; as verified by a standard commercially available mass spectrometer helium leak detector.

The presence of a significant amount of oxygen or nitrogen during the brazing process may create reactions which interfere with full wetting of the joint interface area, which in turn may result in a joint that is not hermetic. Without full wetting, non-wetted areas are introduced into the final joint, in the joint interface area. When sufficient contiguous non-wetted areas are introduced, the hermeticity of the joint is lost.

The presence of nitrogen may lead to the nitrogen reacting with the molten aluminum to form aluminum nitride, and this reaction formation may interfere with the wetting of the joint interface area. Similarly, the presence of oxygen may lead to the oxygen reacting with the molten aluminum to form aluminum oxide, and this reaction formation may interfere with the wetting of the joint interface area. Using a vacuum atmosphere of pressure lower than $5\times10-5$ Torr has been shown to have removed enough oxygen and nitrogen to allow for fully robust wetting of the joint interface area, and hermetic joints. In some embodiments, use of higher pressures, including atmospheric pressure, but using non-oxidizing gasses such as hydrogen or pure noble gasses such as argon, for example, in the process chamber during the brazing step has also led to robust wetting of the joint interface area, and hermetic joints. In order to avoid the oxygen reaction referred to above, the amount of oxygen in the process chamber during the brazing process must be low enough such that the full wetting of the joint interface area is not adversely affected. In order to avoid the nitrogen reaction referred to above, the amount of nitrogen present in the process chamber during the brazing process must be low enough such that the full wetting of joint interface area is not adversely affected.

The selection of the proper atmosphere during the brazing process, coupled with maintaining a minimum joint thickness, may allow for the full wetting of the joint. Conversely, the selection of an improper atmosphere may lead to poor wetting, voids, and lead to a non-hermetic joint. The appropriate combination of controlled atmosphere and controlled joint thickness along with proper material selection and temperature during brazing allows for the joining of materials with hermetic joints.

Figure 8:
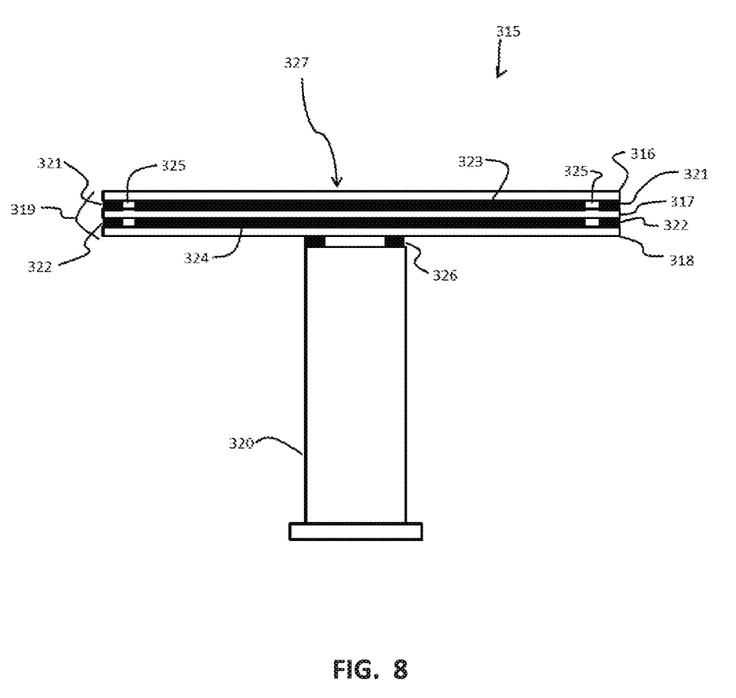
FIG. 8 is a figurative view of an electrostatic chuck according to some embodiments of the present invention.

In some embodiments of the present invention, as seen in FIG. 8, an electrostatic chuck 315 adapted to provide clamping at high temperatures has a multi-layer plate assembly 319 and a shaft 320. The shaft 320 may be a hollow shaft and may contain electrical and gas conduits to support processing operations. The multi-layer plate assembly 319 may have a plurality of plates 316, 317, 318 which are joined together in a single joining step, or in a plurality of steps. A top plate layer 316 may support a substrate on a top surface 327. The top plate layer 316 may be joined to a middle plate layer 317 with a first sealing joint 321, which may be an annular circumferential joint. A clamping electrode 323 may reside between the top plate layer 316 and the middle plate layer 317. In some aspects, the first sealing joint 321 and the clamping electrode 323 are aluminum. A gap 325 may be used to isolate the clamping electrode 323 from the first sealing joint 321. The gap 325 may be under vacuum. In some aspects, there may be a structural labyrinth in the gap 325. In some aspects, the top plate layer 316 may be sapphire and the middle plate layer 317 may be alumina. In some aspects, the first sealing joint 321 and the clamping electrode 323 are of the same material. In some aspects, both the first sealing joint 321 and the clamping electrode 323 are joined to both the top plate layer 316 and the middle plate layer 317 with hermetic joints. In some aspects, the first sealing joint 321 and the clamping electrode 323 are joined to both the top plate layer 316 and the middle plate layer 317 in a single brazing process.

The middle plate layer 317 may be joined to the lower plate layer 318 with a second sealing joint 322. A heater 324 may reside between the middle plate layer 317 and the lower plate layer 318. In some aspects, the first sealing joint 321 and the clamping electrode 323 are joined to both the top plate layer 316 and the middle plate layer 317, and the middle plate layer 317 is joined to the bottom plate layer 318, together in a single brazing process. The shaft 320 may be joined to the bottom plate layer 318 with a third sealing joint 326. In some aspects, the first sealing joint 321 and the clamping electrode 323 are joined to both the top plate layer 316 and the middle plate layer 317, and the middle plate layer 317 is joined to the bottom plate layer 318, and the bottom plate layer 318 is joined to the shaft 320, together in a single brazing process.

In an exemplary embodiment, the top plate layer 316 is sapphire, the middle plate layer 317 and the lower plate layer 318 are alumina, and the shaft 320 is alumina or another ceramic, which may be a ceramic of lower thermal conductivity. The first, second, and third joining layers 321, 322, 326 are aluminum of purity greater than 99%. The entire assembly is joined in a single brazing step at a temperature of 800 C. In some aspects, the brazing temperature may be in the range of 770 C-1200 C. The brazing step is done at a pressure of lower than 10E-4 Torr for a duration of between 1 and 60 minutes.

In another exemplary embodiment, the top plate layer 316 is sapphire and is 0.5 mm thick, the upper braze layer 321 and the clamping electrode 323 are >99% Al and are 0.15 mm thick. In some aspects, the middle plate layer 317 and/or the sapphire layer 316 may be terraced such that the braze layer 321 and the clamping electrode 323 are different thicknesses. The middle plate layer 317 is AlN and is 5.5 mm thick, the lower braze layer is >99% Al and is 0.05 mm thick, and the lower plate layer 318 is AlN and is 5.5 mm thick.

In another exemplary embodiment, the top plate layer 316 is sapphire and is 0.5 mm thick, the upper braze layer is >99% Al and is 0.05 m thick, the middle plate layer 317 is alumina and is 3 mm thick, the lower braze layer is 0.99% Al and is 0.10 mm thick, and the lower plate layer 318 is AlN and is 6 m thick.

Figure 9:
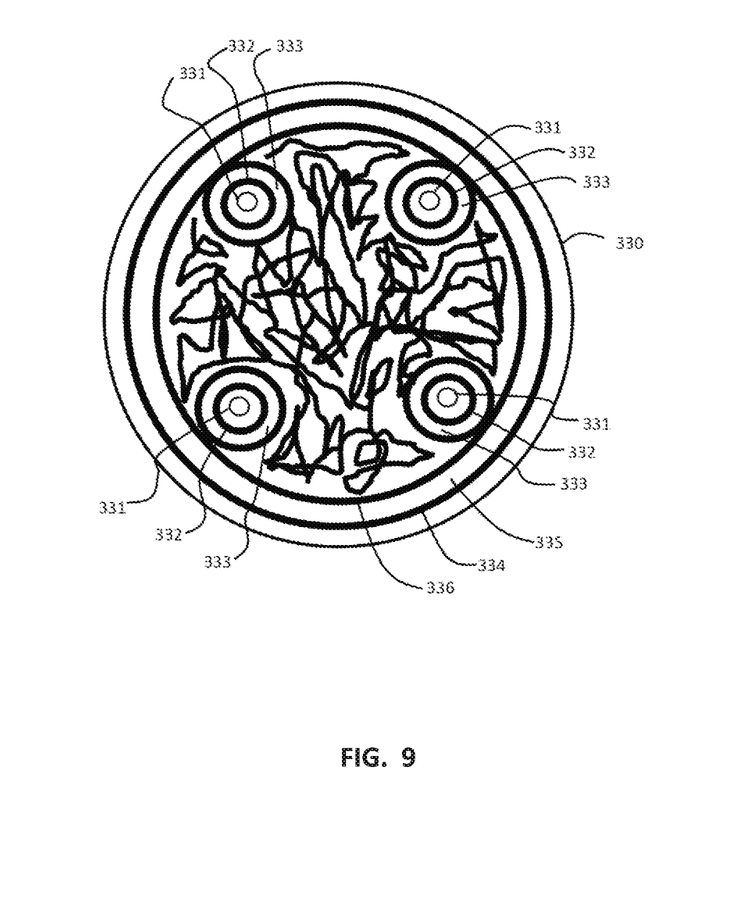
FIG. 9 is an illustration of a clamping electrode according to some embodiments of the present invention.

FIG. 9 illustrates aspects of a clamping electrode 336 as may be used with an electrostatic chuck having pins for removal of the substrate. FIG. 9 may be seen as a vertical sectional view through the first sealing ring 334 between the upper plate layer and the middle plate layer. The clamping electrode 336 is adapted to provide clamping force to the substrate supported by the electrostatic chuck. The clamping electrode may be solid material filling all areas within the borders shown in FIG. 9, this area represented by the jagged lines within circular line 336, and exterior to gaps 333. A first sealing ring 334 is seen around the circumferential perimeter of the plate layer 330. A gap 333 between the first sealing ring 334 and the clamping electrode 336 provides electrical isolation via a gap 335. Pin holes 331 each have sealing rings 332 around their perimeter. The sealing rings 332 have gaps 333 between the sealing rings 332 and the clamping electrode 336.

An electrostatic chuck as described above provides at least the following improvements over prior devices. First, it provides an electrostatic chuck capable of providing clamping at temperatures previously not able to be reached, at temperatures over 500 C. Second, it provides an electrostatic chuck capable of holding substrates and temperature uniformities not previously obtainable. Third, it provides a high temperature clamping chuck which has the opportunity to be reworked and repaired by removal of the top layer of the plate should it become damaged.

The clamping force provided by an electrostatic chuck capable of J-R clamping at temperatures over 450 C, and in the range of 500 C-700 C, allows for a great improvement in processing. As no electrostatic chuck is capable of providing clamping force over approximately 400-450 C, processes which require higher temperature may depend on gravity to hold a wafer, or other substrate, to the support pedestal. Some chemical vapor deposition (CVD) processes are very temperature sensitive, and will be greatly enhanced by the realization of a high temperature electrostatic clamping substrate support. The clamping force may significantly improve, and also even out, the contact between the bottom surface of the substrate and the top surface of the substrate support. The enhanced and evened-out contact allows for more even heat flow from heated substrate support.

An example of a CVD process which may be significantly improved with the use of an electrostatic chuck according to embodiments of the present invention is the application of thin films of amorphous carbon (ACL) in integrated circuit manufacturing. ACL films are typically applied using chemical vapor deposition, and typically applied at temperatures in the range of 500-650 C. An exemplary CVD ACL process may result in a layer of 1,800 angstroms, which may be achieved in approximately 6 minutes. The growth rate of this film is highly temperature dependent. The specified uniformity on such a process may be in the range of 1.2-1.5%. With the addition of a clamping force during such a process, the uniformity expected to be achieved will be below 1%.

In process machinery running such processes, cleaning steps are needed to remove build up of coatings, which may occur on all exposed surfaces. In some cases, cleaning may be done between each substrate that receives deposition. Cleaning chemistry is typically a source of ionized fluorine which is excited to a plasma state for an increased etch rate of the unwanted surface depositions. The cleaning step is also key for material compatibility, as all exposed portions of the electrostatic chuck must be resistant to the fluorine (and other) chemistries. The braze layer, which is exposed to this chemical environment, must be tolerant of such chemistries.

In one embodiment, an electrostatic chuck able to provide electrostatic clamping at high temperatures is provided and can include a plate assembly that includes a top plate layer comprising sapphire, a lower plate layer comprising ceramic, a clamping electrode disposed between the top plate layer and the lower plate layer and a first sealing joint joining the top plate layer to the lower plate layer around an outer periphery of the clamping electrode with a hermetic joint, the first sealing joint including metallic aluminum at greater than 89% by weight.

The first sealing joint can include a metallic aluminum at greater than 99% by weight. The electrostatic chuck can include a shaft joined to the bottom of the plate assembly with a second sealing joint, the shaft including ceramic and the second sealing joint including metallic aluminum at greater than 89% by weight. The electrostatic can include a shaft joined to the bottom of the plate assembly with a second sealing joint, the shaft including ceramic and the second sealing joint including metallic aluminum at greater than 99% by weight. The lower plate layer can include aluminum oxide. The lower plate layer can include aluminum nitride. The clamping electrode can include metallic aluminum of greater than 89% by weight. The clamping electrode can include metallic aluminum of greater than 99% by weight.

In one embodiment, an electrostatic chuck able to provide electrostatic clamping at high temperatures is provided and can include a plate assembly including a top plate layer of a material having a bulk resistivity in the range of 10E9 ohm-cm to 10E11 ohm-cm over the temperature range of 500 C to 750 C, a lower plate layer including ceramic, a clamping electrode disposed between the top plate layer and the lower plate layer and a first sealing joint joining the top plate layer to the lower plate layer around an outer periphery of the clamping electrode with a hermetic joint, the first sealing joint including metallic aluminum at greater than 89% by weight.

The first sealing joint can include metallic aluminum at greater than 99% by weight. The electrostatic chuck can include a shaft joined to the bottom of the plate assembly with a second sealing joint, the shaft including ceramic and the second sealing joint including metallic aluminum at greater than 89% by weight. The electrostatic chuck can include a shaft joined to the bottom of the plate assembly with a second sealing joint, the shaft including ceramic and the second sealing joint including metallic aluminum at greater than 99% by weight. The lower plate layer can include aluminum oxide. The lower plate layer can include aluminum nitride. The clamping electrode can include metallic aluminum of greater than 89% by weight. The clamping electrode can include metallic aluminum of greater than 99% by weight.

In one embodiment, an electrostatic chuck for use in semiconductor processing is provided and can include a plate assembly having a top plate layer of sapphire and a lower plate layer of a ceramic, the plate assembly having a periphery and a hermetically sealed joint between the top plate layer and the lower plate layer at the periphery that is suitable for withstanding a semiconductor processing environment.

The electrostatic chuck can include a clamping electrode disposed between the top plate layer and the lower plate layer within the periphery. The clamping electrode can include metallic aluminum at greater than 89% by weight or metallic aluminum at greater than 99% by weight. The hermetically sealed joint can include metallic aluminum at greater than 89% by weight or metallic aluminum at greater than 99% by weight. The plate assembly can include a shaft joined to the bottom of the plate assembly. The electrostatic chuck can include an additional hermetically sealed joint between the bottom of the plate assembly and the shaft that is suitable for withstanding a semiconductor processing environment. The ceramic of the lower plate layer can include aluminum oxide or aluminum nitride.

In one embodiment, an electrostatic chuck for use in semiconductor processing is provided and can include a plate assembly having a top plate layer of a material having a bulk resistivity in the range of 10E9 ohm-cm to 10E11 ohm-cm over the temperature range of 500 C to 750 C and a lower plate layer of a ceramic, the plate assembly having a periphery and a hermetically sealed joint between the top plate layer and the lower plate layer at the periphery that is suitable for withstanding a semiconductor processing environment.

The electrostatic chuck can include a clamping electrode disposed between the top plate layer and the lower plate layer within the periphery. The hermetically sealed joint can include metallic aluminum at greater than 89% by weight or metallic aluminum at greater than 99% by weight. The plate assembly can include a shaft joined to the bottom of the plate assembly.

In one embodiment, a method for the manufacture of a multi-layer plate device used in semiconductor processing is provided and can include arranging a plurality of plate components into a stack, the plurality of plate components including a top plate layer that includes sapphire, a lower plate layer that includes ceramic, and a brazing layer disposed between that top plate layer and that lower plate layer that includes aluminum of greater than 89% aluminum by weight, joining the top plate layer to the lower plate layer, the step of joining the upper plate layer to the lower plate layer including placing the components into a process chamber, removing oxygen from the process chamber and heating the stack of plate components, thereby joining the top plate layer to the lower plate layer with a hermetically sealed joint.

The step of removing oxygen from the process chamber can include applying vacuum the stack of plate components during the heating of the stack of plate components, wherein the vacuum pressure is lower than 1×10E-4. The step of heating the stack of plate components can include heating the pressurized stack of plate components to a first temperature between 800 C and 1200 C.

As evident from the above description, a wide variety of embodiments may be configured from the description given herein and additional advantages and modifications will readily occur to those skilled in the art. The invention in its broader aspects is, therefore, not limited to the specific details and illustrative examples shown and described. Accordingly, departures from such details may be made without departing from the spirit or scope of the applicant's general invention.

What is claimed is:

1. A method for the manufacture of an electrostatic chuck able to provide electrostatic clamping at high temperatures, said method comprising the steps of:
arranging a plurality of plate components into a stack in a process chamber, said plurality of plate components comprising:
a top plate layer, said top plate layer comprising sapphire;
a lower plate layer, said lower plate layer comprising ceramic;
a clamping electrode disposed between said top plate layer and said lower plate layer; and
a brazing layer disposed between said top plate layer and said lower plate layer around an outer periphery of said clamping electrode, said brazing layer comprising metallic aluminum at greater than 99% by weight;
removing oxygen from said process chamber; and
heating said plurality of plate components, thereby joining said top plate layer to said lower plate layer with a hermetically sealed joint.

2. The method of claim 1, wherein the step of removing oxygen from said process chamber comprises applying vacuum to said plurality of plate components during the heating of said plurality of plate components, wherein a pressure is lower than 1×10E-4 Torr.

3. The method of claim 1, wherein said step of heating the plurality of plate components comprises heating the plurality of plate components to a temperature between 800 C and 1200 C.

4. The method of claim 2, wherein said step of heating the plurality of plate components comprises heating the plurality of plate components to a temperature between 800 C and 1200 C.

5. The electrostatic chuck of claim 1, wherein said lower plate layer comprises aluminum oxide.

6. The electrostatic chuck of claim 1, wherein said lower plate layer comprises aluminum nitride.

7. The electrostatic chuck of claim 2, wherein said lower plate layer comprises aluminum oxide.

8. The electrostatic chuck of claim 2, wherein said lower plate layer comprises aluminum nitride.

9. The electrostatic chuck of claim 3, wherein said lower plate layer comprises aluminum oxide.

10. The electrostatic chuck of claim 3, wherein said lower plate layer comprises aluminum nitride.

11. A method for the manufacture of an electrostatic chuck able to provide electrostatic clamping at high temperatures, said method comprising the steps of:
arranging a plurality of plate components into a stack in a process chamber, said plurality of plate components comprising:
a top plate layer, said top plate layer comprising sapphire;
a lower plate layer, said lower plate layer comprising ceramic;
a clamping electrode disposed between said top plate layer and said lower plate layer; and
a brazing layer disposed between said top plate layer and said lower plate layer around an outer periphery of said clamping electrode, said brazing layer comprising metallic aluminum at greater than 99% by weight; and
heating said plurality of plate components at a joining temperature at 770 C to 1200 C, thereby joining said top plate layer to said lower plate layer with a hermetically sealed joint.

12. The method of claim 11, wherein said hermetically sealed joint has a vacuum leak rate of <1×10E-9 sccm He/sec.

13. The method of claim 11, wherein said lower plate layer comprises at least one of aluminum nitride and aluminum oxide.

14. The method of claim 11 further comprising removing oxygen from said process chamber, wherein the step of removing oxygen from said process chamber comprises applying vacuum to said plurality of plate components during the heating of said plurality of plate components, and wherein a pressure is lower than 1×10E-4 Torr.

15. A method for the manufacture of an electrostatic chuck able to provide electrostatic clamping at high temperatures, said method comprising the steps of:
arranging a plurality of plate components into a stack in a process chamber, said plurality of plate components comprising:
a top plate layer, said top plate layer comprising sapphire;
a middle plate layer, said middle plate layer comprising ceramic;
a bottom plate layer, said bottom plate layer comprising ceramic;
a first brazing layer disposed between said top plate layer and said middle plate layer, said first brazing layer comprising metallic aluminum at greater than 99% by weight; and
a second brazing layer disposed between said middle plate layer and said bottom plate layer, said second brazing layer comprising aluminum;
removing oxygen from said process chamber; and
heating said plurality of plate components, thereby joining said top plate layer to said middle plate layer with a first hermetically sealed joint and said middle plate layer to said bottom plate layer with a second hermetically sealed joint.

16. The method of claim 15, wherein at least one of the first and second hermetically sealed joints have a vacuum leak rate of <1×10E-9 sccm He/sec.

17. The method of claim 15, wherein the step of heating said plurality of plate components comprises heating said plurality of plate components at a joining temperature of at least 770 C.

18. The method of claim 15, wherein the step of heating said plurality of plate components comprises heating said plurality of plate components at a joining temperature at 770 C to 1200 C.

19. The method of claim 15, wherein at least one of said middle plate layer and said bottom plate layer comprise at least one of aluminum nitride and aluminum oxide.

20. The method of claim 15, wherein the step of removing oxygen from said process chamber comprises applying vacuum to said plurality of plate components during the heating of said plurality of plate components, wherein a pressure is lower than 1×10E-4 Torr.

* * * * *